United States Patent
Rangaswamy et al.

(10) Patent No.: US 10,840,173 B2
(45) Date of Patent: Nov. 17, 2020

(54) MULTI-PITCH BALL GRID ARRAY

(71) Applicant: Juniper Networks, Inc., Sunnyvale, CA (US)

(72) Inventors: Granthana Kattehalli Rangaswamy, Acton, MA (US); Arvind Hanumantharayappa, Cupertino, CA (US); Srinivas Venkataraman, Santa Clara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 24 days.

(21) Appl. No.: 16/146,993

(22) Filed: Sep. 28, 2018

(65) Prior Publication Data

US 2020/0105650 A1   Apr. 2, 2020

(51) Int. Cl.
*H01L 23/498* (2006.01)
*H05K 1/11* (2006.01)
*H05K 3/34* (2006.01)
*H01L 23/00* (2006.01)

(52) U.S. Cl.
CPC ........ *H01L 23/49816* (2013.01); *H01L 24/03* (2013.01); *H01L 24/11* (2013.01); *H01L 24/73* (2013.01); *H05K 1/113* (2013.01); *H05K 3/3436* (2013.01); *H01L 24/09* (2013.01); *H01L 24/17* (2013.01); *H01L 2924/15311* (2013.01); *H05K 2201/10734* (2013.01)

(58) Field of Classification Search
CPC ... H01L 23/49816; H01L 24/03; H01L 24/09; H01L 24/11; H01L 24/17; H01L 24/73; H01L 2924/15311; H05K 1/113; H05K 3/3436; H05K 2201/10734
See application file for complete search history.

(56) References Cited

U.S. PATENT DOCUMENTS

| 5,796,170 | A  | * | 8/1998 | Marcantonio | H01L 23/24  257/691 |
| 6,198,635 | B1 | * | 3/2001 | Shenoy | H01L 23/49838  174/261 |
| 6,417,463 | B1 | * | 7/2002 | Cornelius | H01L 23/49816  174/263 |
| 6,538,899 | B1 | * | 3/2003 | Krishnamurthi | H01R 12/58  361/788 |

(Continued)

OTHER PUBLICATIONS

Guenin, "When Moore is Less: Exploring the 3rd Dimension in IC Packaging," www.electronics-cooling.com, Feb. 1, 2009, 5 pp.

(Continued)

*Primary Examiner* — Peter Dungba Vo
*Assistant Examiner* — Jeffrey T Carley
(74) *Attorney, Agent, or Firm* — Shumaker & Sieffert, P.A.

(57) ABSTRACT

A mixed pitch method of placing pads in a ball grid array (BGA) package having a. BGA substrate and a plurality of connectors arranged in an array and connected via the pads to the BGA substrate. Selected pairs of the pads are placed on the BGA substrate at a distance defined by a first pitch PT. Ground pads are placed on the BGA substrate at a distance from the selected pairs of pads defined by a second pitch P2, wherein P2=M*P1 and M is greater than one. The selected pairs of the pads on the BGA substrate are also placed at a distance from other selected pairs of the pads defined by the second pitch P2.

10 Claims, 9 Drawing Sheets

(56) References Cited

U.S. PATENT DOCUMENTS

| | | | | |
|---|---|---|---|---|
| 6,641,411 | B1* | 11/2003 | Stoddard | H01L 23/49838 257/E23.07 |
| 7,935,896 | B2* | 5/2011 | Morlion | H05K 1/114 174/262 |
| 2003/0183419 | A1* | 10/2003 | Miller | H05K 1/112 174/261 |
| 2006/0055049 | A1* | 3/2006 | Nelson | H01L 23/49838 257/774 |
| 2007/0018303 | A1 | 1/2007 | Lee | |
| 2007/0035014 | A1* | 2/2007 | Fung | H05K 1/0231 257/723 |
| 2009/0014206 | A1* | 1/2009 | Motohashi | H05K 1/114 174/262 |
| 2011/0001231 | A1* | 1/2011 | Lovskog | H01L 23/3677 257/693 |
| 2011/0155434 | A1* | 6/2011 | Reynov | H05K 1/114 174/261 |
| 2011/0192640 | A1* | 8/2011 | Liu | H01L 23/49838 174/261 |
| 2014/0104935 | A1 | 4/2014 | Ware et al. | |
| 2014/0367854 | A1 | 12/2014 | Zhao et al. | |
| 2015/0255434 | A1 | 9/2015 | Yazdani | |
| 2015/0279431 | A1 | 10/2015 | Li et al. | |

OTHER PUBLICATIONS

Happich, "Developing and Strengthening 3D IC Manufacture in Europe," Electronics EETimes, Mar. 1, 2013, 21 pp.

Johnson, "3D Memory Chips May Beat 3D Hybrid Memory Cube," EE Times, Sep. 30, 2015, 3 pp.

Maxfield, "2D vs. 2.5D vs. 3D ICs 101," EE Times, Apr. 8, 2014, 7 pp.

Ruhmer, "Lithography Challenges for 2.5D Interposer Manufacturing," 3D InCites, Sep. 4, 2014, 4 pp.

Bagen et al., "Advanced Organic Substrate Technologies to Enable Electronics Miniaturization," Endicott Interconnect Technologies, Inc., Feb. 13, 2013, 35 pp.

"Solder Ball," Wikipedia, the free encyclopedia, retrieved from https://en.wikipedia.org/wiki/Solder_ball, retrieved May 22, 2016, 2 pp.

U.S. Appl. No. 15/198,253, filed Jun. 30, 2016, by Kugel et al.

* cited by examiner

MULTI-PITCH BALL GRID ARRAY

TECHNICAL FIELD

This disclosure relates to semiconductor packaging design and fabrication.

BACKGROUND

A ball grid array (BGA) package is a package having a set of conducting bumps on an insulating substrate. Each ball in the BGA may be an isolated electrical connection through a board via to a circuit node in an integrated circuit (IC) that is attached to the insulating substrate. The IC may rest on an opposite side of the insulating substrate from the BGA, with one or more balls of the BGA connecting to various nodes on the IC. The balls in the BGA may be spaced in a grid array, with each row and column separated by a distance known as a pitch.

SUMMARY

This disclosure describes a structure for a chip package and a printed circuit board (PCB), where the chip package interconnects to the printed circuit board using a ball grid array (BGA) The package includes a substrate configured to receive an integrated circuit and to connect the integrated circuit through the substrate to a ball grid array of connectors, and through the ball grid array of connectors to a printed circuit board (PCB). The BGA of connectors are arranged as a function of a first and second pitch, with selected pairs of connectors separated by the first pitch and other connectors separated by a second, larger, pitch. If some examples, additional grounds are added in the space cleared through the use of the second pitch.

In one example, in a ball grid array (BGA) package having a BGA substrate and a plurality of connectors arranged in an array and connected via signal pads and ground pads to the BGA substrate, a method including placing selected pairs of the signal pads on the BGA substrate at a distance defined by a first pitch P1; placing selected ground pads on the BGA substrate at a distance from adjacent selected pairs of signal pads defined by a second pitch P2, wherein P2=M*P1 and M is greater than one; and placing the selected pairs of the signal pads on the BGA substrate at a distance from adjacent selected pairs of the signal pads defined by the second pitch P2.

In another example, a component comprises a ball grid array package (BGA); and an integrated circuit, wherein the BGA package includes a BGA substrate and an array of BGA connectors, a plurality of pads on the BGA substrate attached to the integrated circuit and a plurality of BGA pads deposited as an array on a side the BGA substrate opposite the pads attached to the integrated circuit and connected to the BGA connectors, wherein the BGA connectors include BGA signal connectors and BGA ground connectors, wherein selected pairs of the BGA signal connectors are placed on the BGA package at a distance defined by a first pitch P1, wherein selected BGA ground connectors are placed on the BGA package at a distance from adjacent selected pairs of BGA connectors defined by a second pitch P2, wherein P2=M*P1 and M is greater than one, and wherein the selected pairs of BGA signal connectors on the BGA package are separated from adjacent selected pairs of BGA signal connectors on the BGA package by a distance defined by the second pitch.

In yet another example, a printed circuit board (PCB) comprises a plurality of layers, including a top layer; and a plurality of pads disposed on the top layer, wherein the plurality of pads are distributed on the top layer in a pattern matching a mixed pitch ball grid array of connectors on a corresponding ball grid array (BGA) package, wherein the plurality of pads includes signal pads and ground pads, wherein selected pairs of signal pads on the top layer are separated by a distance defined by a first pitch, wherein selected ground pads are separated by a distance defined by a second pitch from adjacent selected pairs of signal pads, wherein P2=M*P1 and M is greater than one, and wherein the selected pairs of signal pads are separated from adjacent selected pairs of signal pads by a distance defined by the second pitch.

The details of one or more examples are set forth in the accompanying drawings and the description below. Other features, objects, and advantages will be apparent from the description and drawings, and from the claims.

DETAILED DESCRIPTION

As communication speeds continue to increase, it becomes increasingly difficult to limit signal-to-signal crosstalk at the BGA. The problem is exacerbated as BGA pin density increases. One approach to limit such crosstalk is to provide one row isolation between adjacent transmit (TX) channels and between adjacent receive (RX) channels in order to limit far end crosstalk. In one example approach, one can add a row of isolation by adding a row of ground pads to the BGA package between the TX to TX channels or between the RX to RX channels. If lower levels of crosstalk are needed, one typically adds additional rows of isolation. The problem is that multiple rows of isolation are not a practical way of limiting crosstalk. One reason is that such an approach increases the size of the BGA package, drastically driving up cost.

Instead, one frequently is left with standard isolation techniques which, with a regular 1 mm pitch BGA, result in measures of approximately 20 dB of crosstalk noise at 28 GHz Nyquist. This level of crosstalk noise negatively impacts high speed communications such as 1.12 Gbps signaling. Traditional methods of increasing crosstalk isolation between serial channels and of increasing signal quality by manipulating TX launch (i.e., by increasing TX signal levels via launch voltage settings in the TX channel) at the package BGA may not, therefore, be sufficient to enable higher speed communications. What is described below is a technique that reduces crosstalk and reduces insertion loss deviation by distributing connectors in a ball grid array in a nonuniform fashion. In some example approaches, the technique pushes channel resonances out beyond 30 GHz to achieve 112G operation with PAM4 signaling at 28 GHz Nyquist.

Figure 1:
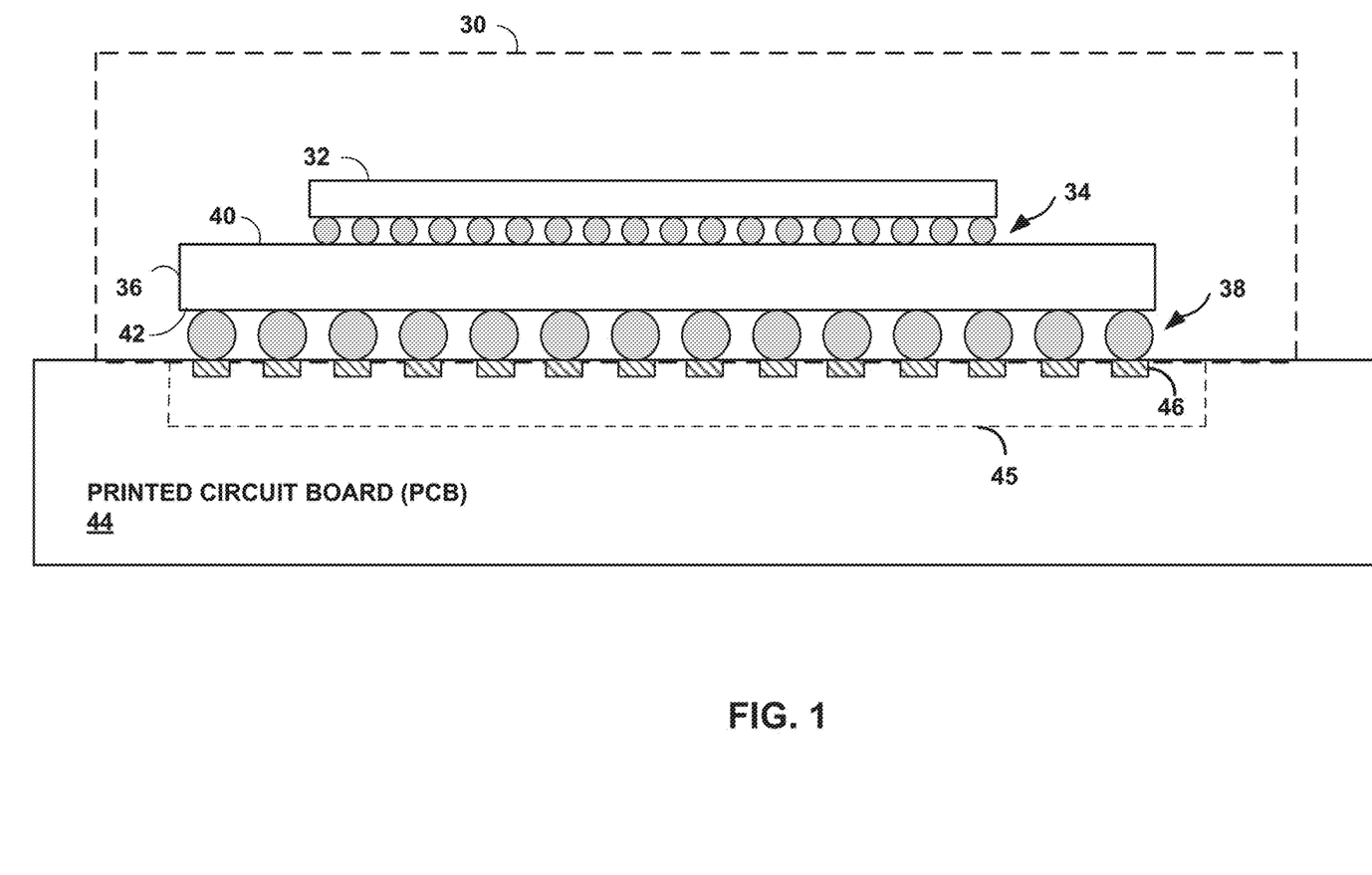
FIG. 1 is a block diagram illustrating an example mixed pitch BGA package, in accordance with techniques of this disclosure.

FIG. 1 is a block diagram illustrating an example mixed pitch BGA package, in accordance with techniques of this disclosure. In the example approach of FIG. 1, package 30 couples an IC 32 through a BGA substrate 36 to a printed circuit board (PCB) 44. In the example approach of FIG. 1, package 30 includes an IC 32, a BGA substrate 36, and a set of connectors arranged as BGA 38. BGA packaging material (not shown) may surround and protect some or all of BGA substrate 36.

In one example approach, the connectors of BGA 38 have a first and a second pitch. Each pitch may be indicative of the distance between connectors (e.g., solder balls) in BGA 38. In the example shown in FIG. 1, package 30 is attached to printed circuit board (PCB) 44 and may conduct electricity from BGA 38 connectors attached to the bottom surface 42 of BGA substrate 36 using pads 46 of PCB 44. In some example approaches, pads 46 are arranged in a BGA package footprint 45 and have a pad size approximately equal to the size of the solder balls used for BGA package 30. In some such example approaches, pads 46 are formed from a conductive metal such as copper.

IC 32 may be coupled to BGA substrate 36 via chip bumps 34, which in FIG. 1 are shown as connecting the bottom surface of IC 32 to the top surface 40 of BGA substrate 36. IC 32 may employ flip-chip technology, also known as controlled collapse chip connection (C4), which may use solder bumps or copper pillars to conduct electricity between IC 32 and BGA substrate 36. Chip bumps 34 may have a pitch that is smaller than the pitch of BGA 38. In some examples, the diameter of chip bumps 34 may be on the order of one hundred micrometers. The pitch of chip bumps 34 may also be on the order of one hundred to two hundred micrometers. In some examples, wire bonds (not shown) are used instead of chip bumps 34 to connect IC 32 to BGA substrate 36.

BGA substrate 36 may facilitate electrical connections between chip bumps 34 and the connectors of BGA 38. BGA substrate 36 may include conductive paths inside of or on either side of BGA substrate 36. Conductive paths inside BGA substrate 36 may include vertical paths, such as vias, or horizontal paths across BGA substrate 36. BGA substrate 36 may include through-organic substrate vias (TOSVs) that are formed by laser drilling or preforming processes.

In some examples, IC 32 may be in die form and may be separate or combined electrical circuits formed on a single piece of semiconductor such as silicon, germanium, or gallium arsenide. Examples of ICs 32 include, but are not limited to, a digital signal processor (DSP), a general purpose microprocessor, an application specific integrated circuit (ASIC), a field programmable gate array (FPGA), a combination thereof, or other equivalent integrated or discrete logic circuitry.

For purposes of illustration, IC 32 may be a serializer/deserializer (serdes) IC. A serdes IC may translate parallel data streams to serial data streams and may translate serial data streams to parallel data streams. As an example, IC 32 may include four ASIC designs, each ASIC design forming one serdes circuit. For instance, one ASIC design may serialize one hundred and twenty-eight inputs data lines into a single data output and/or deserialize one input data line into one hundred and twenty-eight output data lines. Such a design may be used in switches and routers to serialize data to be transmitted in serial data streams and to deserialize received serial data streams.

BGA substrate 36 may be a BGA substrate that includes organic, non-silicon insulating material. BGA substrate 36 may also include conducting material formed as pads on the top and bottom surfaces of BGA substrate 36. IC 32 may attach to BGA substrate 36 such that the pads on top surface 40 of BGA substrate 36 are electrically connected to the input/output (I/O) points of IC 32. The pads on top surface 40 of BGA substrate 36 may be coupled to ball-grid array (BGA) 38 on bottom surface 42 of BGA substrate 36 through vias or other electrical connections. In this way, the I/O points of IC 32 may be electrically coupled through BGA substrate 36 to PCB 44, Examples of the vias through which the I/O pads of IC 32 may connect to the first BGA through BGA substrate 36 include through-organic substrate vias (TOSVs), such as laser-drilled vias, that extend through BGA substrate 36. Alternatively, or additionally, the electrical connections between the I/O points of IC 32 and PCB 44 may be any other suitable connection. The electrical connections between the I/O points of IC 32 may include conductive paths through the insulating material in BGA substrate 36 or across one or both sides of BGA substrate 36, or a combination of interior and exterior conductive paths. In some example approaches, BGA substrate 36 includes vias that couple pads on top surface 40 of BGA substrate 36 to BGA 38 connectors on the bottom surface 42 of BGA substrate 36.

In some example approaches, the connectors in a BGA 38 of this disclosure may be selected from connectors such as solder balls, copper bumps, or any other suitable conductive material. In some examples, BGA substrate 36 may include a land-grid array, pads, or any suitable connector instead of or in combination with BGA 38. A smaller pitch in BGA 38 may mean a higher density of connections, thereby allowing greater fan-out for IC 32.

As noted above, traditional methods of crosstalk isolation and TX launch manipulation at the package BGA may not be sufficient to enable higher speed communications such as 112G signaling. Instead, by distributing connectors of the BA 38 in a combination of pitches, one can increase crosstalk isolation without tweaking TX launch voltage settings. In one example approach, connectors of BGA 38 are placed at different pitches across BGA 38. For instance, as noted above, traditional 1 mm BGA pitch has higher than desired crosstalk noise for applications approaching 100G communication. Mixed pitch BGA pinouts improve BGA crosstalk performance significantly without negatively impacting BGA package size. In one 1 mm example approach, the BGA pitch between differential signal pairs (such as used for serdes) is increased while the pitch between the P and N pins of the differential pairs is kept at 1 mm. For instance, the pitch between pairs of serdes I/O and adjacent END pins of IC 32 may be increased by 25% (1.25 mm) while the pitch between the differential pair pins is kept at 1 mm. The result is, as described in further detail below, that connectors of BGA 38 may be arranged such that the connectors are not evenly spaced. This selective increase in connector spacing significantly reduces TX-TX and RX-RX crosstalk noise.

One may further increase crosstalk noise reduction by adding additional grounds in the space created by the increased pitch. This combined approach has been shown to significantly reduce crosstalk. In simulation TX-TX and RX-RX crosstalk isolation increased from 34 dB to 43 dB by both using mixed pitch BGA pinouts and by inserting grounds in the space created by the increased pitch. Furthermore, the mixed pitch BGA approach may reduce the size of BGA package 30. One package sizing effort showed approximately 10% improvement in package size by using the mixed pitch BGA approach described above. In addition, by using the mixed pitch BGA techniques described herein, the package for a 112G serdes circuit is less than 10% larger than package sizes currently being used for 56G signaling.

In one example approach, P and N for each differential pair may be kept on a 1 mm pitch while distance between a Serdes differential pair pin and an adjacent ground pin is 1.25 mm. In some example approaches, this additional distance of 0.25 mm may be used to add ground vias around the serdes pins, which reduces crosstalk significantly. In fact, the additional ground vias mimic the effect of having two ground row isolation without actually increasing the package size drastically. Preliminary simulations show an improvement in crosstalk over the regular BGA arrangement as noted above. In addition, sizing projections indicate that, by using this approach, one may fit a mixed pitch BGA substrate 36 handling 112 gigabit-per-second (112 G) serdes signals within a BGA package 30 that is approximately 10% smaller than an equivalent design that relies on two ground row isolation.

Figure 2A:
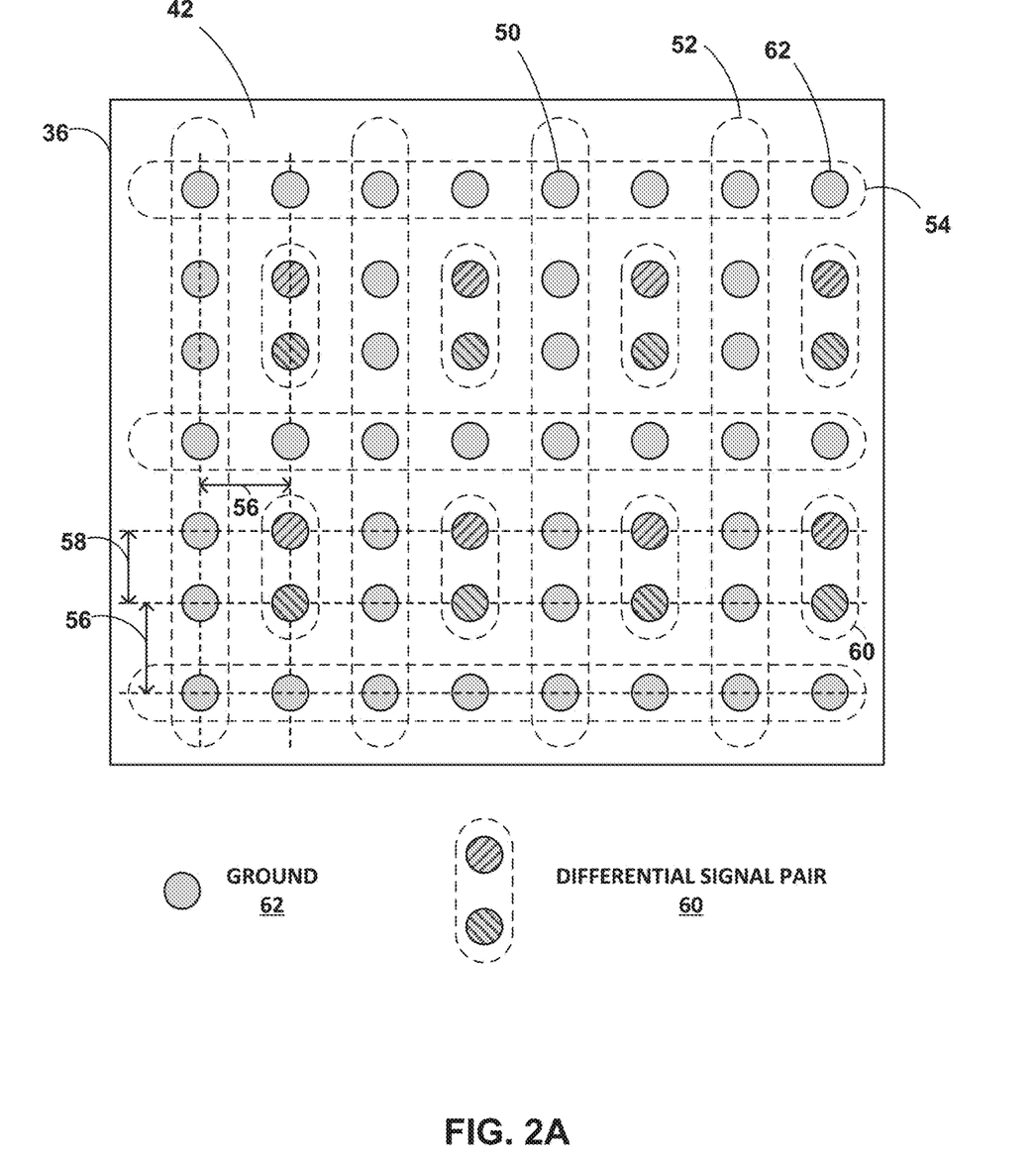
FIG. 2A is a block diagram illustrating example pad placement on a section of a bottom surface of the mixed pitch BGA package of FIG. 1, in accordance with techniques of this disclosure.

FIG. 2A is a block diagram illustrating example pad placement on a section of a bottom surface of the mixed pitch BGA package of FIG. 1, in accordance with techniques of this disclosure. BGA substrate 36 may be composed of organic, non-silicon insulating material and, in this example approach, includes pads 50 that come in contact with individual connectors of BGA 38. Each connector may be a solder ball, a copper bump, a solder bump, a copper pillar, or another suitable material for conducting electricity. Each pad 50 is separated from adjacent pads by one or more of the pitches of the BGA 38.

in the example shown in FIG. 2A, pads 50 corresponding to the mixed pitch BGA 38 are arranged with columns 52 separated by the same pitch 56 and rows 54 separated by either pitch 56 or pitch 58. Rows 54 containing one of a differential signal pair 60 are separated from the row 54 containing the other of the pair of differential signals by a pitch 58 while other rows are separated by pitch 56. Ground pads 62 surround each differential signal pair 60, with rows and columns of grounds 62 separating each differential signal pair 60. BGA package footprint 45 of PCB 44 mirrors the configuration of BGA 38, with pads 46 distributed in a similar multi-pitch manner as discussed for multi-pitch BGA substrate 36 in FIG. 2A. As noted above, such an approach significantly reduces TX-TX and RX-RX crosstalk noise over a traditional 1 mm BGA pitch approach.

Figure 2B:
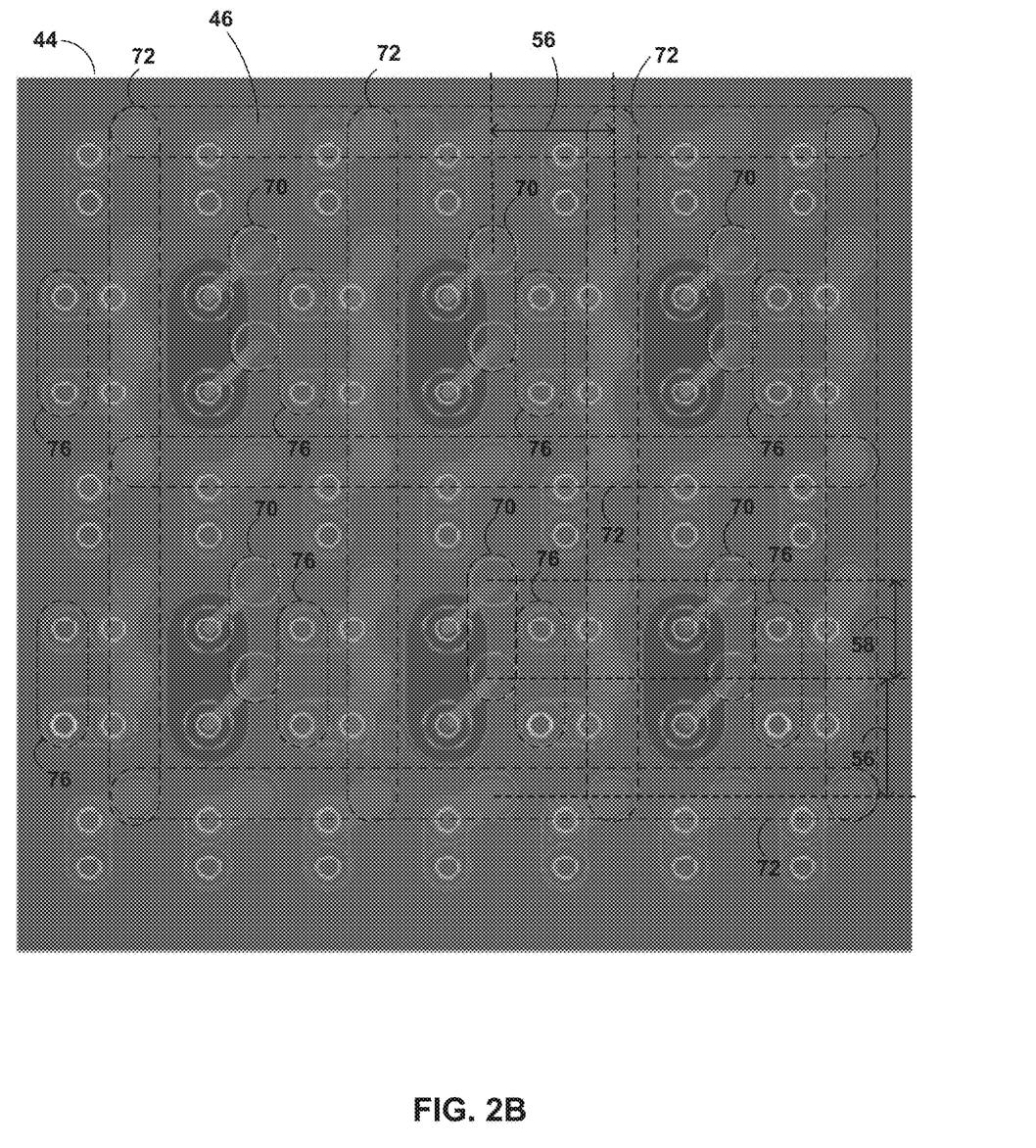
FIG. 2B is a block diagram illustrating a printed circuit board configured to receive a BGA package having the mixed pitch BGA substrate of FIG. 2A, in accordance with techniques of this disclosure.

One can further increase crosstalk isolation by inserting ground vias in PCB 44 in the space created by the increased pitch of multi-pitch BGA 38. FIG. 2B is a block diagram illustrating a printed circuit board configured to receive a BGA package having the mixed pitch BGA substrate of FIG. 2A, in accordance with techniques of this disclosure.

As shown in FIG. 2B, and as reflected in FIG. 2A, pads 46 include signal pads 70 and ground pads 72. In the example approach of FIG. 2B, signal pads 70 are arranged in differential pairs, with pairs of signal pads 70 separated by pitch 58, all columns of pads 46 are separated by pitch 56 while rows without signal pads 70 are also separated by pitch 56. In the example approach of FIG. 2B, as in FIG. 2A, ground pads 62 surround pairs of signal pads 60.

In the example approach shown in FIG. 2B, ground vias 76 have been added to PCB 44 in the space created by the increase in pitch from pitch 58 to pitch 56. Ground vias 76 are connected to existing ground pads 72 and, therefore, do not require the addition of extra connectors to BGA 38, or to BGA package footprint 45. The combination of increased pitch and additional ground vias has characteristics that approach double row isolation, but without the packaging space penalty of double row isolation. As noted above, when pitch 58 is 1 mm and pitch 56 is 1.25 mm, a simulation of the combination of mixed pitch and additional ground vias 76 increased TX-TX and RX-RX crosstalk isolation from 34 dB to 43 dB.

In some example approaches, increased pitch on the outer rows may also be used to increase the antipad size as shown in FIG. 2B, which reduces the capacitance and improves launch. VDD and GND pins in the core of package 30 may also be oriented in a way that allows de-coupling caps to be mounted directly without any additional lead inductance.

Figure 3:
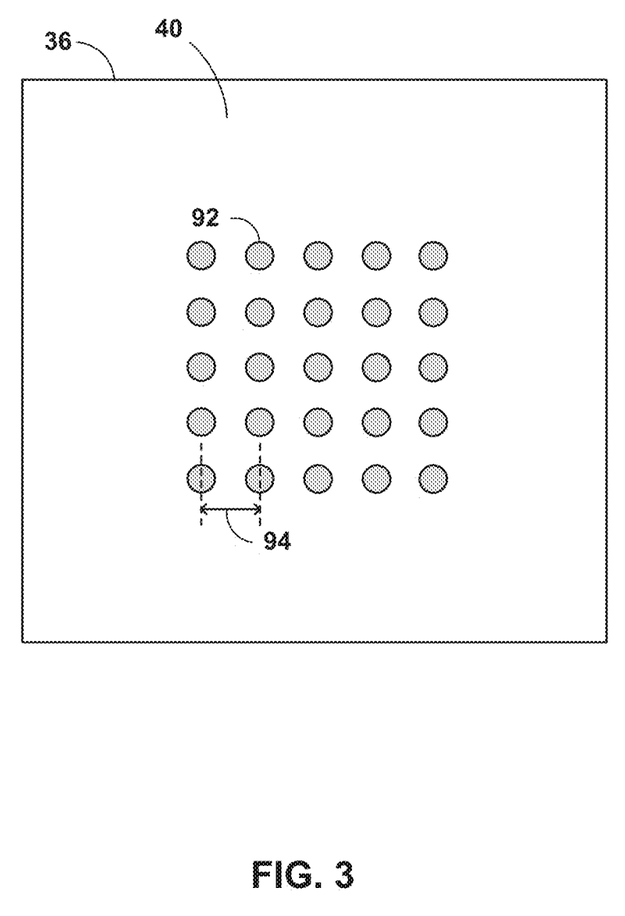
FIG. 3 is a block diagram illustrating an example top surface of the mixed pitch BGA substrate of FIG. 1, in accordance with techniques of this disclosure.

FIG. 3 is a block diagram illustrating an example top surface of the mixed pitch BGA substrate of FIG. 1, in accordance with techniques of this disclosure. Top surface 40 may include an array of pads 92. Each pad 92 is adapted to receive an electrical connector such as a solder bump, a copper pillar, or another suitable material for conducting electricity. Each pad 92 is separated from an adjacent pad in the array of pads 92 by a pitch 94.

Figure 4A:
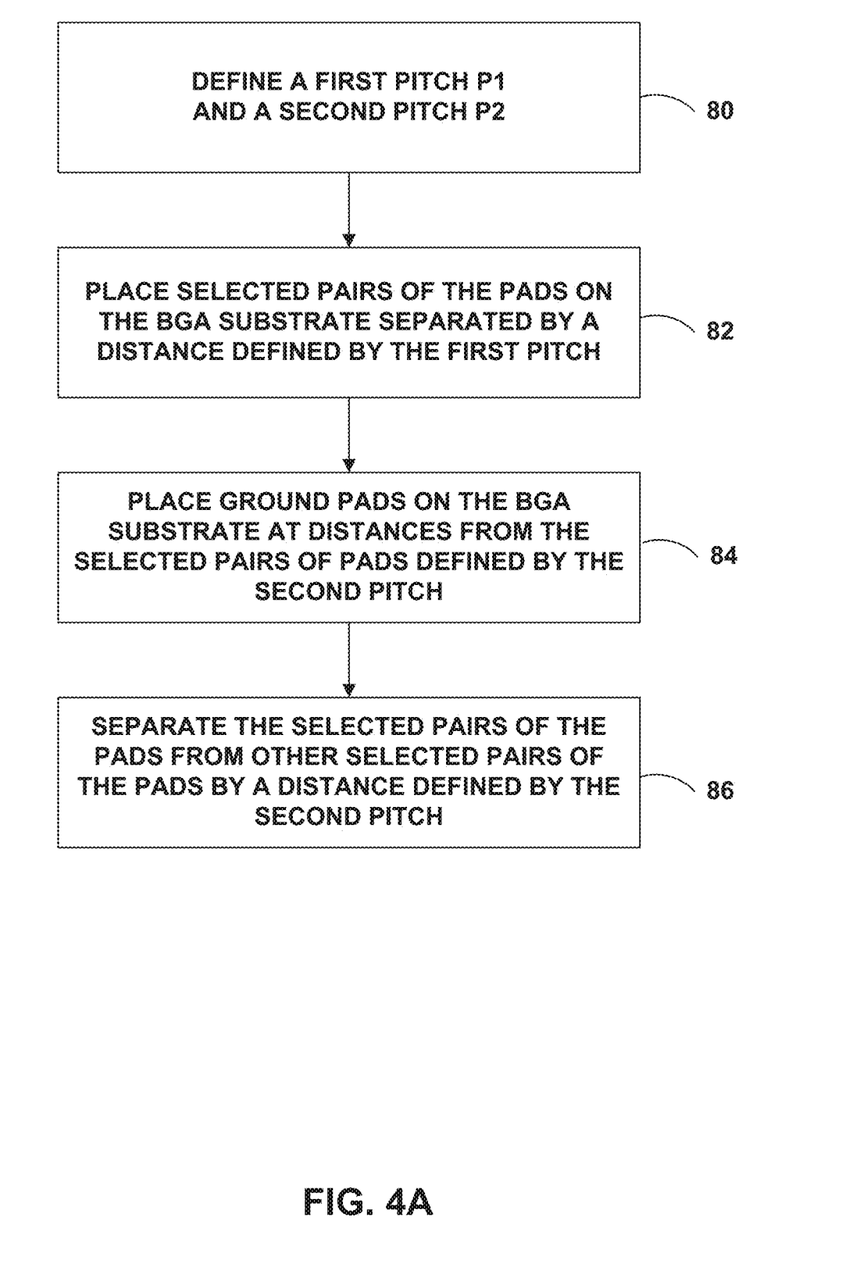
FIG. 4A is a flowchart illustrating an example technique for distributing connector pads on the BGA substrate 36 of FIG. 2A, in accordance with techniques of this disclosure.

Pitch 94 may be smaller than pitch 56 to allow for fan-out of the connections on the top surface of BGA substrate 36. Fan-out from top surface 40 to bottom surface 42 may connect signals received at pads 92 to traces of PCB 44 through pads 46, FIG. 4A is a flowchart illustrating an example technique for distributing connector pads on the BGA substrate 36 of FIG. 2A, in accordance with techniques of this disclosure. The technique is described with reference to the substrate 36 of FIGS. 1 and 2A. Define a first pitch P1 and a second pitch P2 (80), where P2=M*P1 and M is greater than one. Place selected pairs of pads 50 on the BGA substrate separated by a distance defined by the first pitch (82). Place ground pads 62 on the BGA substrate separated from the selected pairs of pads 50 by a distance defined by the second pitch (84). Place the selected pairs of pads 50 on the BGA substrate such that the selected pairs of pads 50 are separated from other selected pairs of pads 50 by a distance defined by the second pitch (86). In some example approaches, the selected pairs of pads 50 include differential signal pairs 60.

Figure 4B:
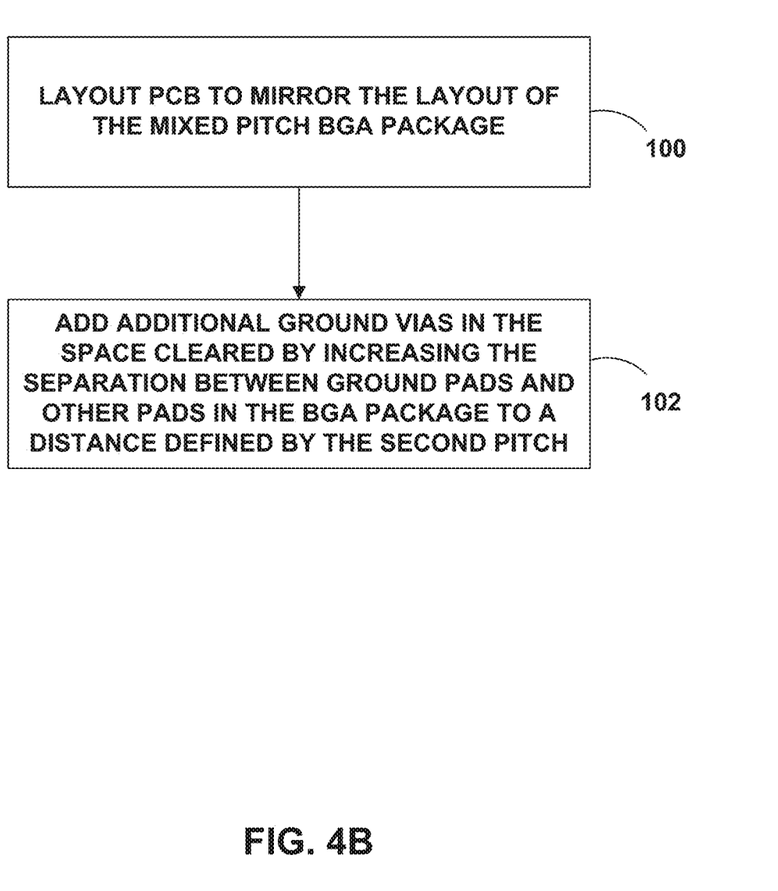
FIG. 4B is a flowchart illustrating an example technique for configuring a printed circuit board to receive the mixed pitch BGA package of FIG. 2A, in accordance with techniques of this disclosure.

FIG. 4B is a flowchart illustrating an example technique for configuring a printed circuit board to receive the mixed pitch BGA package of FIG. 2A, in accordance with techniques of this disclosure. The technique is described with reference to PCB 44 of FIGS. 1 and 2B, based on the pitches described with reference to FIG. 4A and shown in FIG. 2B. Place pads 46 on the package footprint 45 of PCB 44 to mirror the layout of the mixed pitch BGA package 30 being used (100). In one example approach, the layout may mirror the pad layout of BGA substrate 36 of FIG. 2A. In some example approaches, the layout may be similar to PCB 44 of FIG. 2B. Place ground vias 76 in the space created by increasing the separation between ground pads 72 and the selected pairs 70 to a distance defined by the second pitch, as illustrated for example in FIG. 2B(102). In some example approaches, the selected pairs of pads 46 include signal pads 70. In some such example approaches, the pairs of signal pads 70 may be used to transmit or receive differential signals.

In one example approach, a BGA component 30 includes a BGA package (such as shown in FIG. 1) and an integrated circuit 32. The BGA package includes a BGA substrate 36 and an array 38 of BGA connectors 48. A plurality of pads 92 on the BGA substrate 36 are attached to the integrated circuit 32 and a plurality of BGA pads 50 are arranged as an array on a side the BGA substrate 36 opposite the pads 92 and are connected to the BGA connectors 48. The BGA connectors 48 include BGA signal connectors and BGA ground connectors. Selected pairs of the BGA signal connectors are placed on the BGA package at a distance defined by a first pitch P1. Selected BGA ground connectors are placed on the BGA package at a distance from adjacent selected pairs of BGA connectors defined by a second pitch P2, wherein P2=M*P1 and M is greater than one. And, the selected pairs of BGA signal connectors on the BGA package are separated from adjacent selected pairs of BGA signal connectors on the BGA package by a distance defined by the second pitch.

In one example approach, a corresponding printed circuit board (PCB) includes a plurality of layers, including a top layer and a plurality of pads 46 disposed on the top layer, wherein the plurality of pads 46 are distributed on the top layer in a pattern matching a mixed pitch ball grid array of connectors on a corresponding ball grid array (BGA) package as described above. In one such example approach, the plurality of pads 46 includes signal pads and ground pads, wherein selected pairs of signal pads on the top layer are separated by a distance defined by a first pitch, wherein selected ground pads are separated by a distance defined by a second pitch from adjacent selected pairs of signal pads, wherein P2=M*P1 and M is greater than one, and wherein the selected pairs of signal pads are separated from adjacent selected pairs of signal pads by a distance defined by the second pitch.

In one example approach, VDD and GND pads are grouped together in an array of pads 50 separated from adjacent pads by a distance defined by a third pitch. For instance, the VDD and GND pads may be placed in the center of BGA substrate 36, with differential signal pairs 60 (e.g., serdes pads) and additional GND pads 62 distributed at the periphery of BGA substrate 36. In one such example approach, substrate 36 may include spacing of 0.8 mm near the VDD and GND pins at the center and spacing of 1.25 mm near the differential signal pairs 60. Based on this, the pitch between two sets of differential signal pairs would be 2.5 mm instead of the traditional 2 mm.

Figure 5:
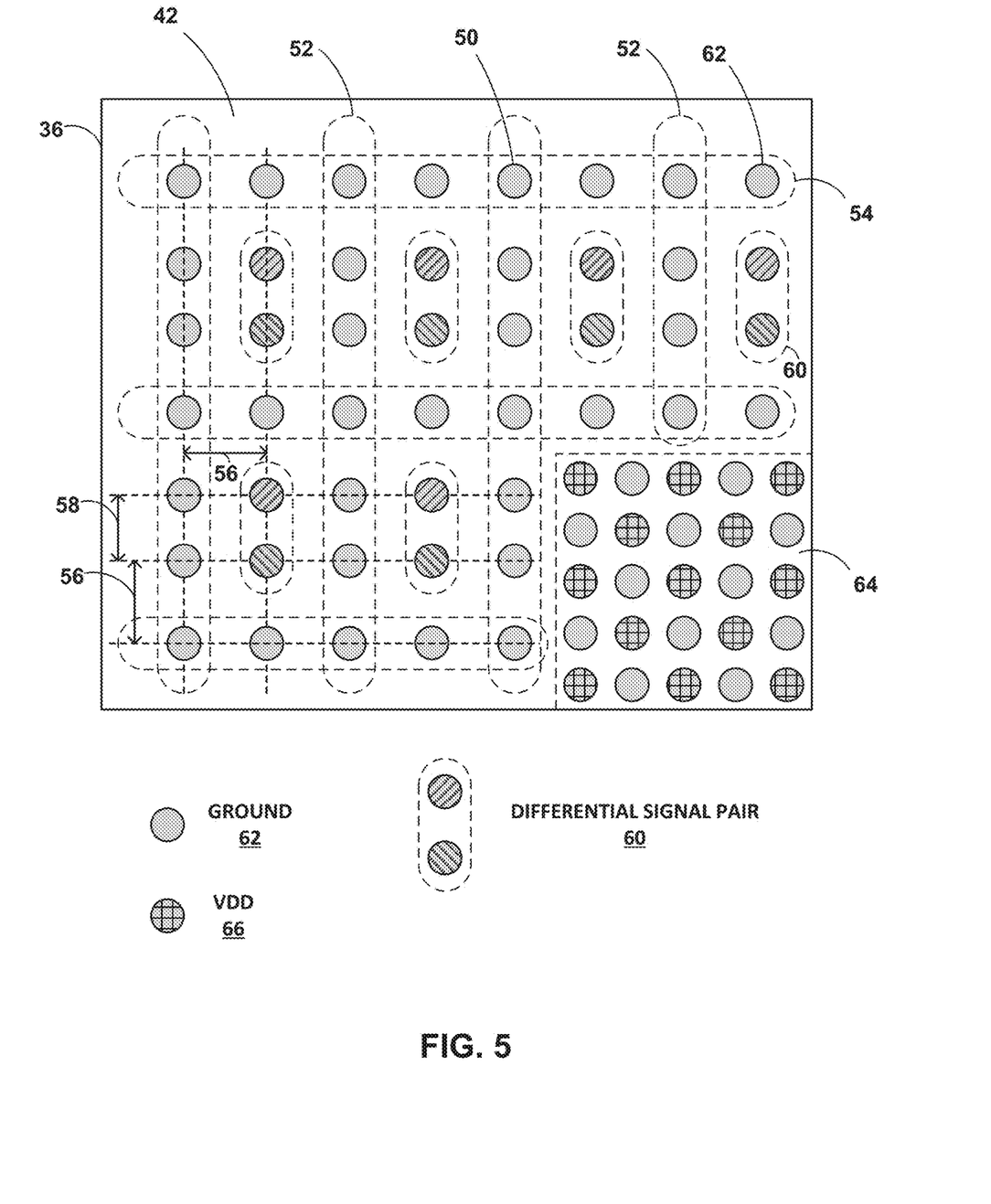
FIG. 5 is a block diagram illustrating example pad placement on a section of a bottom surface of the mixed pitch BGA substrate of FIG. 1, in accordance with techniques of this disclosure.

FIG. 5 is a block diagram illustrating example pad placement on a section of a bottom surface of the mixed pitch BGA substrate 36 of FIG. 1, in accordance with techniques of this disclosure. BGA substrate 36 may be composed of organic, non-silicon insulating material and, in this example approach, includes pads 50 that come in contact with individual balls of BGA 38. Each ball may be a solder ball, a copper bump, a solder bump, a copper pillar, or another suitable material for conducting electricity. Each pad 50 is separated from adjacent pads by one or more of the pitches of the BGA 38.

In the example shown in FIG. 5, pads 50 corresponding to the mixed pitch BGA 38 are arranged with columns 52 separated by the same pitch 56 and rows 54 separated by either pitch 56 or pitch 58. Rows 54 containing one of a differential signal pair 60 are separated from the row 54 containing the other of the pair of differential signals by a pitch 58 while other rows are separated by pitch 56. Ground pads 62 surround each differential signal pair 60, with rows and columns of grounds 62 separating each differential signal pair 60. As noted above, such an approach significantly reduces TX-TX and RX-RX crosstalk noise over a traditional 1 mm BGA pitch approach. In contrast to the example shown in FIGS. 2A and 2B, the example approach of FIG. 5 includes a section 64 having power (VDD) pads 66 and ground pads 62 separated by a third pitch which is less than the first pitch. As noted above, in an example approach where the first pitch is 1 mm and the second pitch is 1.25 mm, the third pitch may be defined as 0.8 mm. As in the example shown in FIG. 2B, one can further increase crosstalk isolation by inserting ground vias 76 in the space on the corresponding package footprint 45 of PCB 44 created by the increased pitch of the second pitch.

in one example approach, one may use the third pitch in sections of bottom surface 42 to reduce the length or width of BGA substrate 36. Such an approach may be used, for example, for low frequency signal lines.

Figure 6A:
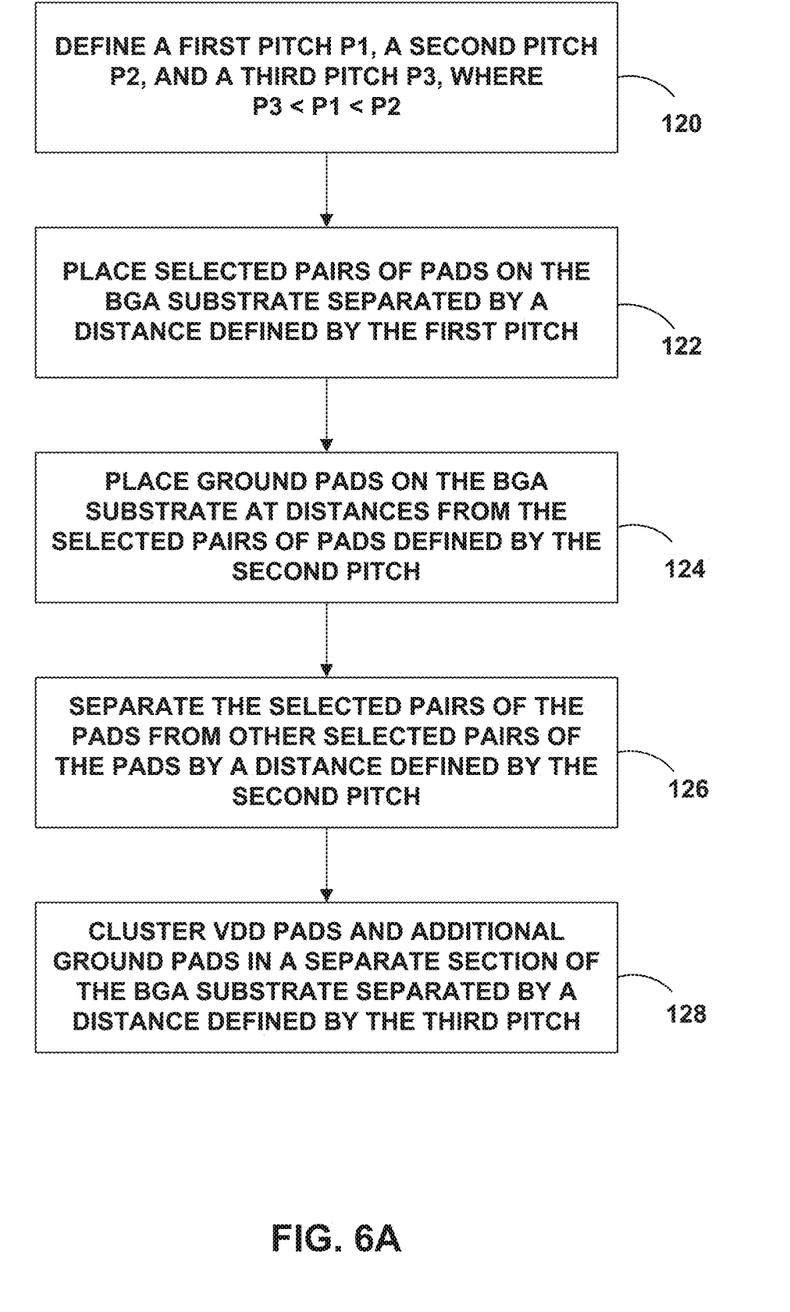
FIG. 6A is a flowchart illustrating an example technique for distributing connector pads on the BGA substrate of FIG. 5, in accordance with techniques of this disclosure.

FIG. 6A is a flowchart illustrating an example technique for distributing connector pads on the BGA substrate 36 of FIG. 5, in accordance with techniques of this disclosure. The technique is described with reference to the substrate 36 of FIG. 5. Define a first pitch P1, a second pitch P2, and a third pitch P3, where P3<P1<P2 (120). Place selected pairs of pads on the BGA substrate separated by a distance defined by the first pitch (122). Place ground pads on the BGA substrate separated from the selected pairs of pads by a distance defined by the second pitch (124). Place the selected pairs of pads on the BGA substrate such that pairs are separated from other pairs by a distance defined by the second pitch (126).

Figure 6B:
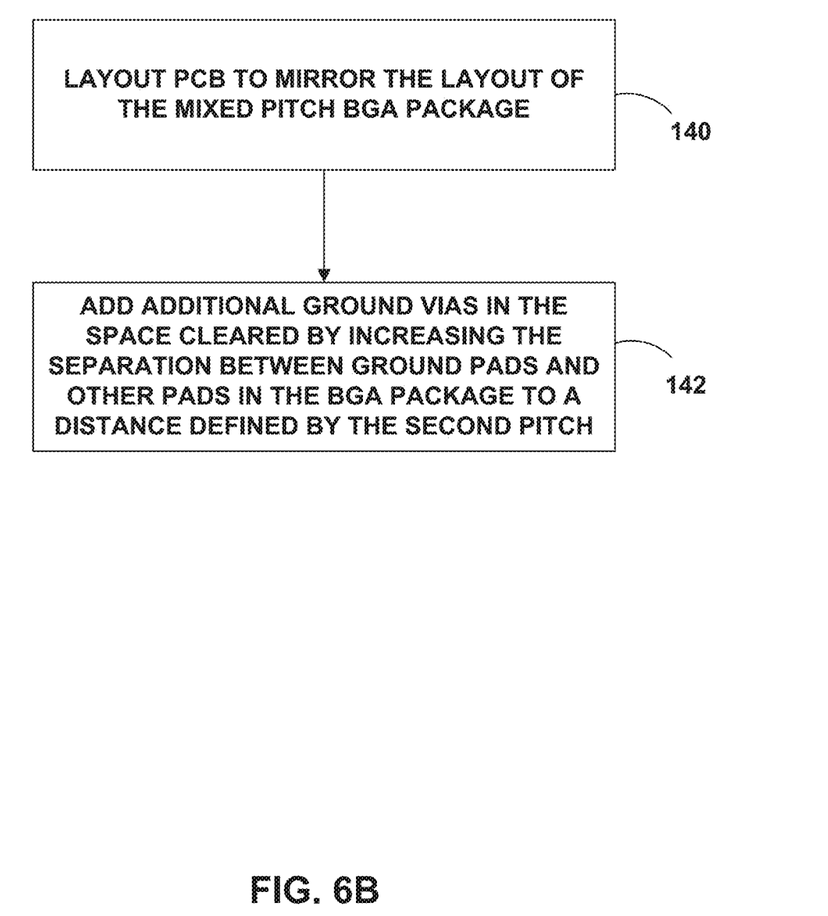
FIG. 6B is a flowchart illustrating an example technique for configuring a printed circuit board to receive a BGA package having the mixed pitch BGA substrate of FIG. 5, in accordance with techniques of this disclosure.

FIG. 6B is a flowchart illustrating an example technique for configuring a printed circuit board to receive a BGA package having the mixed pitch BGA substrate of FIG. 5, in accordance with techniques of this disclosure. The technique is described with reference to the substrate 36 of FIG. 5, based on the pitches described with reference to FIG. 6A and shown in FIG. 5. Place pads 46 on the package footprint 45 of PCB 44 to mirror the layout of the mixed pitch BGA package 30 being used (140). In one example approach, the layout may mirror the pad layout of BGA substrate 36 of FIG. 5. Place ground vias (such as ground vias 76 of FIG. 2B) in the space created by increasing the separation between ground pads 72 and the selected pairs of pads 46 on PCB 44 to a distance defined by the second pitch (148). As shown in FIG. 2B, ground vias 76 may be placed between existing ground pads 72 and existing signal pads 70 to increase TX-TX and RX-RX isolation.

The techniques described above provide significant crosstalk noise reduction and better signal launch to enable high speed communication such as 112G serdes signaling using standard PCB and package manufacturing methods. In addition, the techniques provide an advantage by reducing the package size needed to accommodate high speed communication such as 112G serdes signaling. Package sizes for the new designs are expected to increase less than 10% per side over the ASIC packages used for lower speed 56G signaling.

What is claimed is:

1. A method for constructing a ball grid array (BGA) package having a BGA substrate and a plurality of connectors arranged in an array and connected via differential pairs of signal pads and ground pads to the BGA substrate, each pad of the differential pairs of signal pads and each pad of the ground pads configured to receive one of the plurality of connectors, the method comprising:

depositing a first differential pair of the signal pads on the BGA substrate, wherein a first pad of the first differential pair is separated from a second pad of the first differential pair at a first center-on-center distance defined by a first pitch P1, wherein the first differential pair is configured to transmit a signal as a voltage difference across the first pad and the second pad;

depositing ground pads on the BGA substrate, wherein a closest neighboring ground pad is separated by at least a second center-on-center distance from the first and second pads of the first differential pair, wherein the second center-on-center distance is defined by a second pitch P2, wherein $P2 = M*P1$ and M is greater than one; and depositing additional differential pairs of the signal pads on the BGA substrate, wherein pads of the additional differential pairs are separated by at least a third center-on-center distance from adjacent ground pads defined by the second pitch P2.

2. The method of claim 1, wherein the connectors include solder balls.

3. The method of claim 1, wherein the connectors are further connected through power pads to the BGA substrate, the method further comprising:

depositing the power pads and additional ground pads in a section of the BGA substrate at center-on-center distances apart defined by a third pitch P3, wherein $P3 = N*P1$, wherein $0 < N < 1$.

4. The method of claim 3, wherein the power pads include VDD pads arranged in a checkerboard pattern with the additional ground pads.

5. The method of claim 3, wherein $N = 1/M$.

6. The method of claim 3, further comprising depositing one or more of the additional ground pads at distances from one or more signal pads defined by the third pitch.

7. The method of claim 1, wherein portions of the array are arranged as rows and columns of connectors, with the differential pairs of signal pads deposited in adjacent rows in the same column, the method further comprising:

separating columns of the connectors in the array as a function of the second pitch; and separating rows of the connectors in the array that do not include one of the differential pairs of signal pads as a function of the second pitch.

8. The method of claim 1, further comprising depositing antipads in areas of the BGA substrate where spaces were created by separating the differential pairs of signal pads from adjacent ground pads by the second pitch that are larger than antipads in other areas of the BGA substrate.

9. The method of claim 8, wherein the signal pads are coupled to the antipads.

10. The method of claim 1, wherein each differential pair of the differential pairs of signal pads is separated from an adjacent differential pair of signal pads by a single row of ground pads or a single column of ground pads.

* * * * *

UNITED STATES PATENT AND TRADEMARK OFFICE
CERTIFICATE OF CORRECTION

PATENT NO. : 10,840,173 B2
APPLICATION NO. : 16/146993
DATED : November 17, 2020
INVENTOR(S) : Granthana Kattehalli Rangaswamy, Arvind Hanumantharayappa and Srinivas Venkataraman It is certified that error appears in the above-identified patent and that said Letters Patent is hereby corrected as shown below:

On the Title Page

Item (57), Line 3: replace "(BGA) package having a. BGA substrate and a plurality of" with --(BGA) package having a BGA substrate and a plurality of--
Item (57), Line 6: replace "on the BGA substrate at a distance defined by a first pitch PT." with --on the BGA substrate at a distance defined by a first pitch P1.--

Signed and Sealed this
Seventh Day of June, 2022

*Katherine Kelly Vidal*

Katherine Kelly Vidal
*Director of the United States Patent and Trademark Office*